US 6,720,195 B2

(12) United States Patent
Jensen

(10) Patent No.: US 6,720,195 B2
(45) Date of Patent: Apr. 13, 2004

(54) METHODS EMPLOYING ELEVATED TEMPERATURES TO ENHANCE QUALITY CONTROL IN MICROELECTRONIC COMPONENT MANUFACTURE

(75) Inventor: David G. Jensen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/145,986

(22) Filed: May 15, 2002

(65) Prior Publication Data

US 2003/0215979 A1 Nov. 20, 2003

(51) Int. Cl.[7] ............................................. G01R 31/26
(52) U.S. Cl. ................................... 438/15; 438/612
(58) Field of Search .......................... 438/15, 106, 127, 438/612

(56) References Cited

U.S. PATENT DOCUMENTS

| | | | |
|---|---|---|---|
| 4,766,670 A | * 8/1988 | Gazdik et al. | 29/830 |
| 5,304,842 A | 4/1994 | Farnworth et al. | |
| 5,470,787 A | 11/1995 | Greer | |
| 5,831,445 A | 11/1998 | Atkins et al. | |
| 5,888,850 A | * 3/1999 | Havens et al. | 438/127 |
| 5,897,326 A | 4/1999 | Eldridge et al. | |
| 5,903,058 A | 5/1999 | Akram | |
| 6,015,722 A | * 1/2000 | Banks et al. | 438/108 |
| 6,091,252 A | 7/2000 | Akram et al. | |
| 6,147,374 A | * 11/2000 | Tanaka et al. | 257/295 |
| 6,211,052 B1 | 4/2001 | Farnworth | |
| 6,219,908 B1 | 4/2001 | Farnworth et al. | |
| 6,222,280 B1 | 4/2001 | Farnworth et al. | |
| 6,248,613 B1 | * 6/2001 | Matsuura et al. | 438/106 |
| 6,263,566 B1 | 7/2001 | Hembree et al. | |
| 6,294,270 B1 | * 9/2001 | Clough | 428/620 |
| 6,337,577 B1 | 1/2002 | Doherty et al. | |
| 6,429,113 B1 | * 8/2002 | Lewis et al. | 438/612 |

OTHER PUBLICATIONS

Sony, "Sony Semiconductor Products Lead–free Package," Sony Jul. 2000, 8 pages, <http://www.world.sony.com/semi/>.
National Semiconductor, "Semiconductor Packaging Assembly Technology," 2000 National Semiconductor Corporation, Aug. 1999, 8 pages, www.national.com.

* cited by examiner

*Primary Examiner*—Erik J. Kielin
*Assistant Examiner*—Stephen W. Smoot
(74) *Attorney, Agent, or Firm*—Perkins Coie LLP

(57) ABSTRACT

Aspects of the invention provide various methods and apparatus for delivering more reliable packaged microelectronic components. One embodiment provides a method in which packaged microelectronic components are heated to a reflow temperature of a selected solder before the solder is applied. After the solder is applied, the performance of the packaged microelectronic component can be tested and any packaged microelectronic component that fails to meet minimum performance criteria can be rejected as defective. Such a process may help identify microelectronic components that may pass normal testing procedures, but fail during a subsequent solder reflow operation. One embodiment provides a system that includes a suitable heating apparatus and a solder plating apparatus, with the heating apparatus being adapted to heat and cool packaged microelectronic components before they are delivered to the solder plating apparatus.

32 Claims, 5 Drawing Sheets

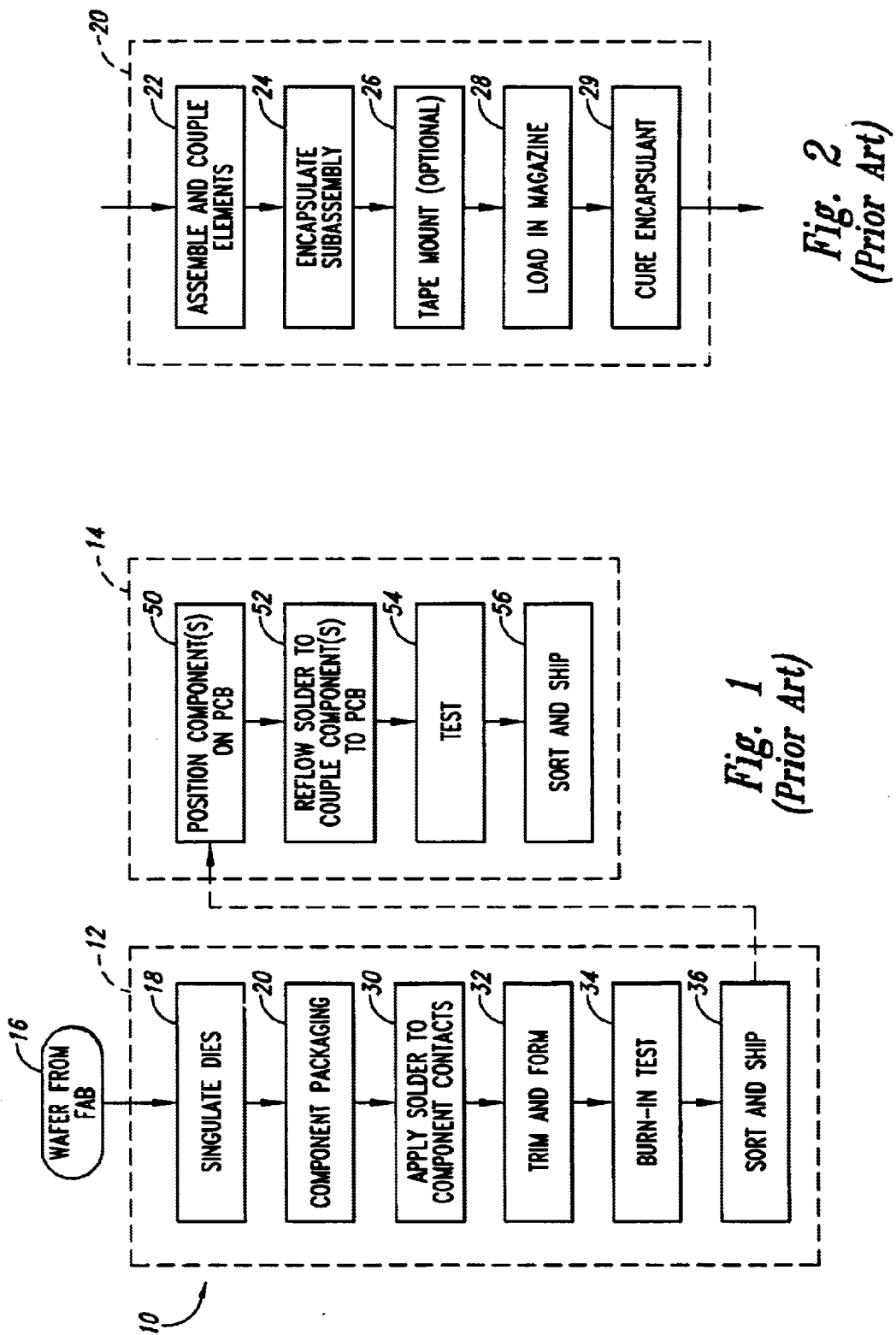

METHODS EMPLOYING ELEVATED TEMPERATURES TO ENHANCE QUALITY CONTROL IN MICROELECTRONIC COMPONENT MANUFACTURE

TECHNICAL FIELD

This invention relates to the manufacture of microelectronic components. More particularly, aspects of the invention provide methods and apparatus for enhancing quality control in a microelectronic component manufacturing operation.

BACKGROUND

Microelectronic devices are commonly assembled by coupling together two or more microelectronic components. Some of these microelectronic components may comprise single, unpackaged semiconductor dies which are electrically coupled to other components of the microelectronic device, e.g., attaching the die to a printed circuit board (PCB) or other substrate using wire bonding or flip chip techniques.

Increasingly, packaged microelectronic components are being used to assemble larger microelectronic devices. Packaged microelectronic components typically comprise one or more semiconductor dies, a lead frame that is coupled to the die or dies, and an encapsulant that commonly encapsulates the semiconductor die(s) and a portion of the lead frame. One example of such a packaged microelectronic component and suitable methods of manufacture are disclosed in U.S. Pat. No. 5,304,842, the entirety of which is incorporated herein by reference. Other packaged microelectronic components may include small conductive pads instead of a lead frame, with the conductive pads being exposed and permitting the encapsulated die or dies to be electrically coupled to a PCB or other microelectronic component.

Such packaged microelectronic components are commonly mass-produced and subsequently assembled into larger microelectronic devices. One technique for electrically coupling packaged microelectronic components to other components of a microelectronic device employs a solder applied to the leads or conductive pads of the packaged microelectronic component prior to assembly with the rest of the device. The solder is commonly applied using electrolytic or electroless plating processes. Each of the solder-bearing microelectronic components may then be juxtaposed with a PCB or other microelectronic component, with the solder-bearing contacts of the packaged microelectronic components aligned with corresponding contacts on the PCB. The entire microelectronic device (including the packaged microelectronic component and the PCB) may then be heated to an elevated temperature at which the solder will flow, electrically coupling and physically connecting the packaged microelectronic component to the PCB. This technique, commonly referred to as a solder reflow process, is widely used in commercial manufacture of microelectronic devices. Solder reflow processes avoid the need to precisely apply separate balls of solder to a number of specific locations on a PCB on a one-by-one basis. This enhances throughput of a microelectronic device manufacturing operation. The heating required to reflow the solder can cause some other difficulties, though.

Most packaged microelectronic component manufacturers test each packaged microelectronic component before shipping it to a customer. This helps the customer minimize production losses and costs for remanufacturing devices including defective components. Experience has demonstrated that some packaged microelectronic components that meet all relevant performance criteria when the component manufacturer ships them do not perform properly in the assembled microelectronic device. It is believed that many of these "infant mortalities" can be attributed to the thermal stress placed on the packaged microelectronic component during the solder reflow operation. The various elements of the packaged microelectronic component often have different coefficients of thermal expansion (CTEs). For example, the CTE of the encapsulant may be materially different from the CTE of the semiconductor die or dies, and the lead frame and associated bonding wires may have CTEs that are different from the CTE of the encapsulant or the die. The relatively rapid temperature changes of the solder reflow process may induce stresses that cause a previously functional packaged microelectronic component to fail.

Testing procedures utilized by packaged microelectronic component manufacturers often employ an elevated temperature for an extended period of time. Such a "burn-in" process can weed out some components that would otherwise have failed over time during use. However, the maximum temperature of the testing process must be significantly lower than the reflow temperature of the solder to avoid damaging the finish of the solder. This can be an even greater problem with advanced multi-layer solders, e.g., the solder suggested in U.S. Pat. No. 5,470,787, the entirety of which is incorporated herein by reference. Typically, burn-in temperatures are less than 150° C., frequently less than 125° C. As a consequence, the thermal stresses induced in the solder reflow process can be significantly higher than thermal stresses which can be generated in a burn-in testing process without damaging otherwise acceptable packaged microelectronic components.

BRIEF DESCRIPTION OF THE DRAWINGS

FIG. 1 is a schematic flow diagram of a conventional manufacturing operation.

FIG. 2 is a schematic flow diagram of the component packaging step of FIG. 1.

DETAILED DESCRIPTION

Figure 3:
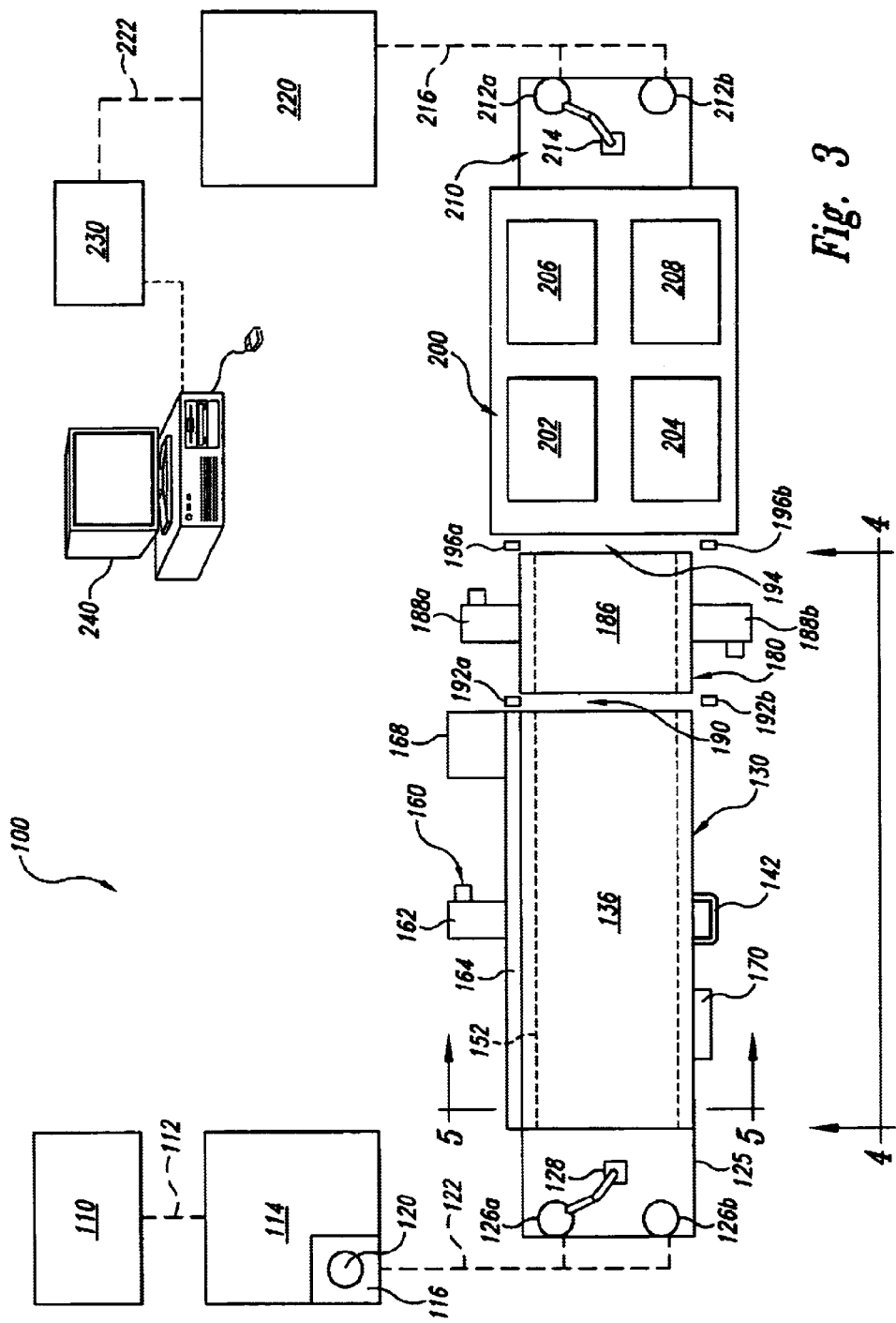
FIG. 3 schematically illustrates a microelectronic component manufacturing system in accordance with one embodiment.

Various embodiments of the present invention provide methods of manufacturing microelectronic components and apparatus for use in manufacturing microelectronic components. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description. To facilitate understanding and readability, one exemplary design of a microelectronic device manufacturing line is discussed, followed by a description of methods in accordance with other embodiments of the invention.

One embodiment of the invention provides a method of processing a packaged microelectronic component. In this method, the packaged microelectronic component may be heated to a reflow temperature of a selected solder, which may be on the order of 215° C. or greater. After the heated packaged microelectronic component has cooled to a temperature below the reflow temperature, the selected solder may be applied to contacts carried by the cooled packaged microelectronic component. Performance of the solder-bearing packaged microelectronic component can be tested and any packaged microelectronic component that fails to meet minimum performance criteria in the performance testing can be rejected as defective.

Another particular embodiment of the invention provides a system for processing microelectronic components. The system may include a cure station adapted to receive a first magazine carrying a plurality of microelectronic components, each of which includes a curable encapsulant. The cure station may be adapted to cure the curable encapsulant by heating the microelectronic components to an encapsulant cure temperature in the first magazine. A pre-solder heating apparatus may be adapted to heat the packaged microelectronic components to a reflow temperature of a selected solder. The reflow temperature is greater than the encapsulant cure temperature. A first transport is adapted to transport the magazine of cured microelectronic components from the cure station to the pre-solder heating system and transfer the cured microelectronic components out of the first magazine and to the pre-solder heating system. A solder plating apparatus may be adapted to receive the microelectronic components from the pre-solder heating system. This solder plating apparatus may be adapted to deposit the selected solder on contacts (e.g., leads or conductive pads) or the microelectronic components. A testing system is adapted to test performance of the solder-bearing microelectronic components. A second transport may be adapted to transfer the microelectronic components from the solder plating apparatus to a second magazine and transport the second magazine for further processing.

Conventional Processing

FIGS. 1 and 2 schematically illustrate various stages in one conventional process for manufacturing microelectronic devices from a semiconductor wafer. Turning first to FIG. 1, the manufacturing process 10 generally includes a packaged microelectronic component manufacturing process 12 and a microelectronic device assembly process 14. The packaged microelectronic component manufacturing process 12 starts by receiving a semiconductor wafer from a semiconductor fabrication facility in step 16. These wafers are typically 200–300 millimeters in diameter and contain a large number of semiconductor dies. The dies are singulated in step 18. The dies may be singulated in any conventional fashion, e.g., by attaching the semiconductor wafer to a dicing tape, cutting the wafer with a wafer saw to separate the dies from one another, and removing individual dies from the dicing tape.

These singulated dies may be packaged in a component packaging subprocess 20. FIG. 2 illustrates the component packaging subprocess 20 in more detail. In step 22, the various elements of the desired microelectronic component may be assembled and coupled to one another. By way of example, a semiconductor die may be positioned with respect to a lead frame and contacts on the die may be wire-bonded to the leads of the lead frame using conventional wire bonding equipment, such as that available from Kulicke & Soffa. To increase circuit density in microelectronic devices, many packaged microelectronic components being manufactured today employ two or more semiconductor dies, which may be attached to one another and/or to a lead frame or the like. Once the elements of the microelectronic component are assembled and electrically coupled together in the desired fashion in step 22, this subassembly may be encapsulated with an encapsulant in step 24. A wide variety of encapsulants are commercially available from companies such as Thermoset, Lord Chemical Products of Indiana, U.S.A. (e.g., CIRCUITSAF encapsulants) and Dow Corning of Michigan, U.S.A. (e.g., JCR6810 encapsulant). The encapsulant is commonly enclosed within a mold and may substantially completely surround and enclose the semiconductor die(s). Most conventional encapsulants are thermoplastics that are heat cured from a flowable delivery state to a more rigid state.

If so desired, these encapsulated subassemblies may be mounted on a mounting tape in step 26. In some embodiments, a series of individual subassemblies may be attached to a oontinuous mounting tape and the lead frame or other structure may be mounted on the same mounting tape adjacent. In other embodiments, a series of lead frames may be attached to one another (e.g., as a strip or matrix of lead frame openings joined together by their respective dams) and each of the dies may be attached to a paddle or the like of a specific lead by a separate small piece of mounting tape. Whether or not the encapsulated subassemblies are mounted on a mounting tape or the like in step 26, a plurality of the encapsulated subassemblies is typically loaded into a magazine (step 28) for transport. Such magazines are well known in the art and available in a variety of custom or standard configurations.

The encapsulant may be cured in step 29. This is commonly accomplished by placing the magazine filled with a number of the subassemblies in a cure chamber. The encapsulant can be heated in this cure chamber in accordance with the manufacturer's instructions for the particular encapsulant used. Typical thermal profiles for conventional encapsulant curing may involve temperatures of 125–175° C. for an extended period of time ranging from a number of hours to 30 minutes or less.

After the component is packaged in subprocess 20, solder may be applied to contacts of the packaged component in step 30. This can be done in a variety of fashions. In one conventional manufacturing process, the solder is applied to exposed length of the lead frame using electrolytic or electroless deposition techniques. Any suitable solder may be used. Currently, most solders used in these applications are lead-tin solders, though a number of researchers are attempting to develop suitable lead-free solders. The solders may be homogeneous, or may include a more complex structure, e.g., by having an outer layer of tin to serve as an antioxidant.

Once the solder has been applied, the leads may be trimmed to cut away the lead frame. The leads may then be formed into a desired configuration, e.g., by being bent at a 90-degree angle to provide an array of downwardly-oriented leads which can be received in conductive holes in a printed circuit board or the like.

The trim and form step 32 yields a finished packaged microelectronic component. As noted above, the packaged microelectronic components may be tested to identify components that are likely to fail in the field. This may be accomplished using a conventional burn-in testing process, which may involve heating the packaged microelectronic component and applying voltages either statically or dynamically to the packages. The performance of the circuits in response to the applied voltages may be monitored during the burn-in test in step 34. Any packaged microelectronic components that fail to meet predefined minimum performance criteria can be identified as defective. The defective components may be sorted from the rest of the components and the known good components can be prepared for shipping to a customer in step 36.

The packaged microelectronic components produced in the manufacturing process 12 can be shipped to a customer for assembly into a finished microelectronic device in the microelectronic device manufacturing process 14 shown in FIG. 1. This manufacturing process 14 may include positioning multiple components on a PCB. While at least one of the components positioned on the PCB may be a packaged microelectronic component produced in the process 12, a variety of other known components may also be employed in the same microelectronic device. Once the components are positioned on the PCB, this subassembly may be heated to a reflow temperature of the solder applied in step 30. This reflowed solder may then be allowed to cool, both electrically coupling and essentially physically welding the packaged microelectronic components to the PCB (step 52). This final assembled microelectronic device may be tested in step 54. Any defective devices may be sorted from the rest of the devices and the products may be shipped to customers in step 56.

Exemplary Apparatus

Figure 4:
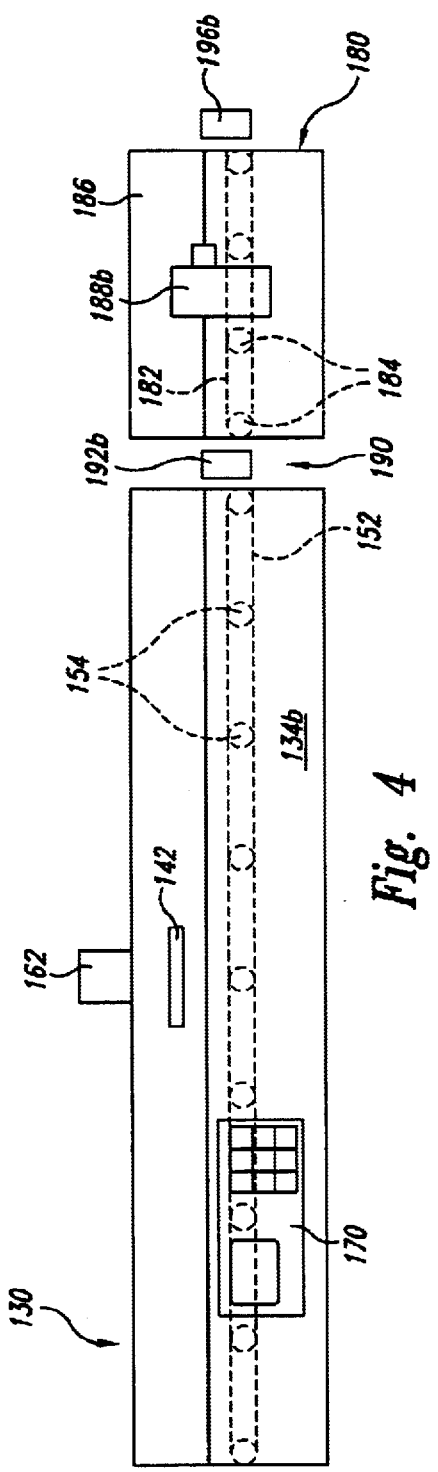
FIG. 4 is a schematic side view of a portion of the system of FIG. 1 along line 4—4 in FIG. 3.
Figure 5:
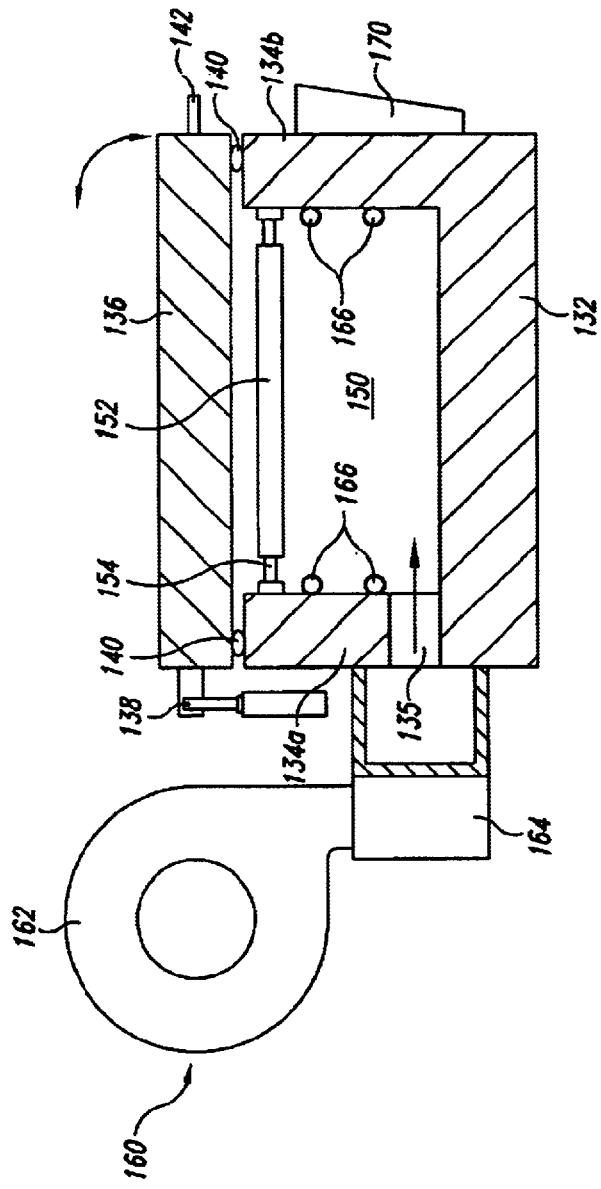
FIG. 5 is a schematic cross-sectional view of a portion of the system of FIG. 1, taken along line 5—5 FIG. 3.

FIGS. 3–5 schematically illustrate a microelectronic component manufacturing system 100 in accordance with one embodiment of the invention. This manufacturing system 100 includes a wafer processing apparatus 110. The wafer processing apparatus 110 may employ conventional mechanisms for receiving a semiconductor wafer, mounting the wafer on a dicing tape, cutting or scribing the wafer, and removing the singulated dies from the dicing tape. The wafer processing apparatus 110 may also include a loading mechanism adapted to load the singulated dies into a conventional die magazine (not shown).

The die magazine, with a plurality of singulated dies therein, may be delivered to a component packaging system 114 via any suitable transfer mechanism, schematically shown as transfer 112 in FIG. 3. For example, the transfer 112 may include a robot or an automated cart adapted to transfer a die magazine from the wafer processing apparatus 110 to the component packaging system 114.

The component packaging system 114 includes conventional mechanisms (not shown) for assembling and electrically coupling the various elements of the component and molding an encapsulant about those elements. These encapsulated subassemblies may be loaded in a magazine 120 and positioned in a cure station 116 of the component packaging system 114. The cure station 116 is adapted to treat the encapsulated subassemblies in the magazine 120 in accordance with the manufacturer's specifications for the selected encapsulant material. In one embodiment, the cure station includes an oven cavity which is adapted to maintain an elevated temperature for an extended period of time to heat treat the encapsulated subassemblies at a cure temperature suitable for the selected encapsulant.

The magazine 120 with the cured microelectronic components may be transported from the component packaging system 114 to a heating apparatus 130. This transport may be accomplished in any of a variety of ways. In one embodiment, the entire magazine 120 is transferred to the heating apparatus 130 via a suitable transfer mechanism, schematically illustrated as transfer 122 in FIG. 3. This transfer may operate in much the same manner as the transfer 112 discussed above. A first loading station 125 may be positioned adjacent an end of the heating apparatus 130. In the illustrated embodiment, the first loading station 125 includes a first magazine bay 126a and a second magazine bay 126b, each of which is adapted to receive a microelectronic component-filled magazine 120. A robot 128 or other suitable mechanism may be used to remove the microelectronic components from the magazines 120 in the magazine bays 126a–b and deliver them sequentially to the heating apparatus 130. As noted above, the cured microelectronic components may be mounted on a mounting tape. In one embodiment, a plurality of microelectronic components can be arranged in a strip-like fashion on a single length of mounting tape and a plurality of these strip-like lengths may be carried in a single magazine 120. In such an embodiment, the robot 128 can remove a single strip of microelectronic components from the magazine and deliver it to the heating apparatus 130.

The heating apparatus 130 is detailed in FIGS. 3–5. A bottom wall 132, a pair of sidewalls 134a and 134b, and a lid 136 may define an oven chamber 150 of the heating apparatus 130. In the illustrated embodiment, the lid 136 is pivotable about a hinge 138 to allow access to the oven chamber 150. The lid 136 may be provided with a manually graspable handle 142 and a peripheral seal 140 can help seal the lid 136 against the upper edges of the sidewalls 134a–b. A component transport 152 may be positioned within the oven chamber 150 and extend along substantially the entire length of the oven chamber 150. The transport should be adapted to support packaged microelectronic components within the oven chamber 150 and move the components along the length of the heating apparatus 130. In the illustrated embodiment, the transport 152 comprises a conveyor belt that may be supported on a series of rollers (154 in FIG. 4).

A pressurized air supply 160 may be used to circulate air within the oven chamber 150. In the illustrated embodiment, the air supply 160 comprises a blower 162 which delivers air to a plenum 164 which may extend along substantially the entire length of the heating apparatus 130. Pressurized air within the plenum 164 can be delivered to the oven chamber 150 through a series of passages 135 through the sidewall 134a. In one embodiment, a heat source may be included in the pressurized air supply 160 to deliver heated air to the oven chamber 150 to heat the microelectronic components. In such an embodiment, the control of the temperature profile along the length of the heating apparatus 130 may be substantially flat.

In the illustrated embodiment, a series of heating elements 166 may be positioned within the oven chamber 150 below the microelectronic components supported on the transport 152. These heating elements 166 will heat the air delivered from the air supply 160 after it enters the oven chamber 150. The heating elements 166 may be connected to a power supply 168. In one embodiment, a series of independently controllable sets of heating elements 166 are spaced along the length of the heating apparatus 130 and the power supply 168 can be controlled to deliver varying power levels to different sets of heating elements 166, establishing a desired temperature profile along the length of the heating apparatus. In one embodiment, establishing two or three separately controllable segments of the oven chamber 150 can provide a suitable temperature profile along the length of the heating apparatus 130. A control panel 170 may be used to display operating parameters of the heating apparatus 130 and allow an operator to adjust the control parameters. For example, a plurality of thermocouples (not shown) can be spaced along the length of the oven chamber 150 to measure the temperature profile of the heating apparatus 130, which may be displayed on the control panel 170. The control panel 170 may be operatively associated with the power supply 168 to control the power delivered to the heating elements 166 to adjust this temperature profile.

As discussed below, the packaged microelectronic components may be heated within the heating apparatus 130 to a temperature which approaches or exceeds the reflow temperature of the solder which will be applied to the leads or other electrical contacts of the components. The microelectronic components may cool somewhat during pretreatment and/or rinsing stages of the solder plating apparatus 200, described below. In one advantageous embodiment, however, the microelectronic components are allowed to cool to a temperature below the solder reflow temperature before they are delivered to the plating apparatus 200. If so desired, the microelectronic components simply may be allowed time to cool in ambient air before they are delivered to the solder plating apparatus 200. In the illustrated embodiment, the heating apparatus 130 includes a cooling chamber 180 that is disposed between the oven chamber 150 and the solder plating apparatus 200. The cooling chamber 180 may take any desired form. The cooling chamber 180 of FIGS. 3 and 4 includes a transport 182 for moving microelectronic components along the length of the cooling chamber 180. The transport 182 may comprise a conveyor belt supported on a plurality of rollers 184, much like the transport 152 of the oven chamber 150. A manually liftable lid 186 may provide access to the interior of the cooling chamber 180 for maintenance or inspection purposes. One or more blowers 188 may blow ambient air through the interior of the cooling chamber 180, speeding up cooling of the microelectronic components. In the illustrated embodiment, two separate blowers 188a and 188b are positioned on transversely opposite sides of the cooling chamber 180.

In one embodiment, a single, continuous transport mechanism may transport microelectronic components along the entire length of the heating apparatus 130, i.e., through the oven chamber 150 and the cooling chamber 180. In the alternative embodiment shown in FIGS. 3 and 4, two separate transports 152 and 182 are employed and microelectronic components will be transferred from the first transport 152 to the second transport 182. In the heating apparatus 130 of FIGS. 3–5, the cooling chamber 180 is spaced from the oven chamber 150, defining a transfer gap 190 therebetween. This gap 190 can facilitate independent thermal control of the oven chamber 150 and the cooling chamber 180. The transfer gap 190 is desirably narrower than the width of the microelectronic components (or a strip thereof) which is transported through the heating apparatus 130. If so desired, a dropped product detector 192 may be positioned adjacent the transfer gap 190. In one embodiment, the dropped product detector 192 comprises an optical transmitter 192a and an optical receiver 192b. Any product which drops into the transfer gap 190 will interrupt the beam of light from the transmitter 192a to the receiver 192b, which can trigger an alarm or an automatic shutdown of the transports 152 and 182 to avoid damaging the products.

The heated and subsequently cooled microelectronic components may be delivered directly from the cooling chamber 180 to a suitable solder plating apparatus 200. In one embodiment (not shown), a robot may be positioned to transfer microelectronic components from the cooling chamber 180 to the plating apparatus 200. In the illustrated embodiment, though, the plating apparatus 200 is positioned proximate the exit of the cooling chamber 180. The cooling chamber 180 may be spaced a small distance from the plating apparatus 200, defining an exit gap 194. A dropped product detector 196 comprising an optical transmitter 196a and optical receiver 196b may monitor the exit gap 194 much like the detector 192 monitors the transfer gap 190.

The solder plating apparatus 200 shown schematically in FIG. 3 includes a series of separate processing stations. In particular, microelectronic components may be moved sequentially through a pretreatment station 202, a rinse station 204, a plating station 206, and a drying station 208. Such solder plating apparatus 200 are well known in the industry and are commercially available from a variety of sources; a Meco EPL1800 plating system is expected to suffice. The precise nature of the operations performed in the pretreatment station 202, rinse station 204, plating station 206, and drying station 208 will depend on the solder being deposited and the specific chemistry utilized. Most commercial solder plating equipment deposits a tin-lead solder plating on the exposed lead frames of the microelectronic packages. The solder may be plated on the leads using electroplating or electroless plating, for example. Nickel-palladium solders can also be applied in much the same fashion. The process baths employed in the stations 202–208 may be carefully monitored for chemical composition, temperature and the like. If the solder is to be deposited electrolytically, other operating parameters such as voltage and current density may be precisely controlled in the plating station 206. The appearance, solderability and reflow temperature, composition, and thickness of the applied solder are key quality control parameters of the solder plating apparatus 200.

In the illustrated embodiment of the manufacturing system 100, the solder is applied in the solder plating apparatus 200 via electrolytic or electroless plating. In certain other embodiments, other solder deposition techniques, e.g., chemical vapor deposition and/or physical vapor deposition, may instead be employed.

The solder-bearing microelectronic components may be delivered from the solder plating apparatus 200 to a trim and form apparatus 220. The microelectronic components may be transported from the solder plating apparatus 200 to the trim and form apparatus 220 in any desired fashion. In the illustrated embodiment, the individual microelectronic components or strips of microelectronic components carried on mounting tape may be loaded into magazines in a second loading station 210. This second loading station may include two magazine bays 212a and 212b and a robot 214 to deliver the components or strips of components into the magazines. The magazines may then be transferred (schematically illustrated as paths 216) to the trim and form apparatus 220.

A wide variety of appropriate equipment for the trim and form apparatus 220 is commercially available from a variety of sources. Generally, the individual leads of the leadframe of each microelectronic component may be separated from the leadframe strip, e.g., using a laser or a saw. The separated leads may be placed in appropriate tooling, cut to shape, and mechanically formed into the desired configuration. J-bend and Gull-wing shapes are commonly used for packaged microelectronic components that will be surface-mounted on a PCB or the like.

Once the packaged microelectronic components have been finalized in the trim and form apparatus 220, they can be shipped directly to customers. In a preferred embodiment, though, these packaged microelectronic components are tested before they are shipped to customers. In the schematic illustration of FIG. 3, the packaged microelectronic components may be transferred along path 222 from the trim and form apparatus 220 to a test apparatus 230. Any conventional packaged microelectronic component testing system can be employed as the testing apparatus 230. In one embodiment, the test apparatus 230 is adapted to heat the microelectronic components in accordance with a predefined heat treatment regimen. During the heat treatment, voltage can be applied to the packaged microelectronic components and their response to the voltage may be monitored, e.g., using a suitable processor-based system such as a programmed computer 240. Any microelectronic component that does not meet certain predefined minimum performance criteria can be rejected as defective. The defective microelectronic components identified in the burn-in test can be separated out and only "known good" components will be shipped to customers or used in further manufacturing processes, such as the microelectronic device manufacturing process 14 outlined in FIG. 1 and discussed above.

Exemplary Methods of Manufacture

Microelectronic components may be manufactured in a variety of ways in accordance with different embodiments of the invention. For ease of understanding, the following discussion of some exemplary embodiments refers to the specific manufacturing system 100 shown in FIG. 3. It should be recognized, however, that aspects of the present invention could be used to manufacture microelectronic components using other suitable apparatus, as well.

Figure 6:
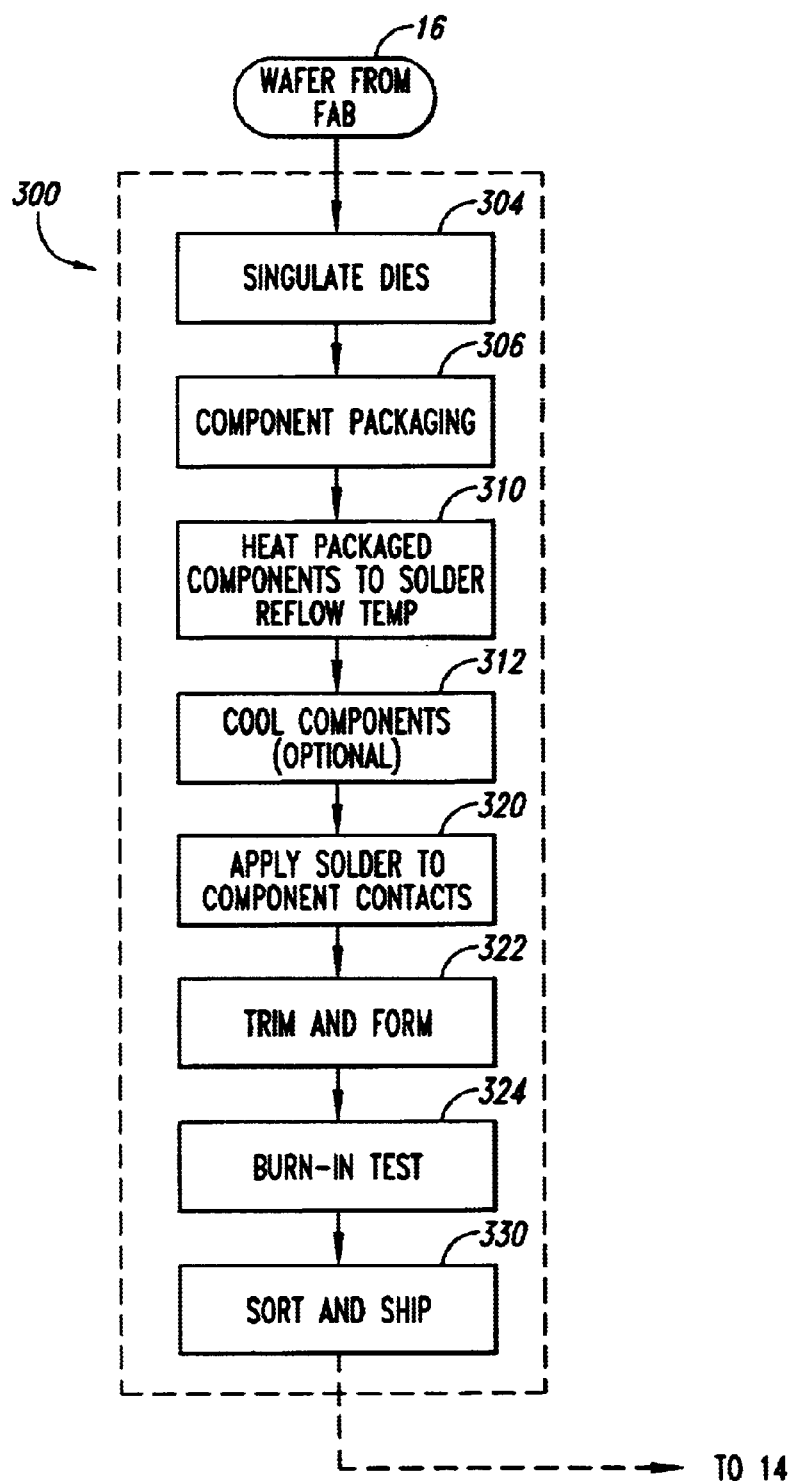
FIG. 6 is an exemplary schematic flow diagram in accordance with another embodiment.

FIG. 6 schematically illustrates an improved packaged microelectronic component manufacturing process 300 in accordance with one embodiment of the invention. This improved process 300 can be used instead of the conventional process 12 in the flow diagram of FIG. 1.

As with the conventional process 12, the packaged microelectronic component manufacturing process 300 of FIG. 6 may start at step 16 with receipt of a semiconductor wafer from a fabrication process. In step 304, individual dies can be singulated from the wafer in the wafer processing apparatus 110, as explained previously. The singulated dies may be assembled with other elements and encapsulated in the composite packaging step 306 using the composite packaging system 114. The composite packaging subprocess 306 of FIG. 6 may be substantially the same as the subprocess 20 shown in FIG. 2 and detailed above.

The resulting packaged microelectronic component may then be heated to a suitable elevated temperature in the heating apparatus 130 (step 310). The temperature profile of the heating process can be controlled as desired. In one embodiment, the packaged microelectronic components are heated to the reflow temperature of the solder to be applied in the solder plating apparatus 200. This solder reflow temperature will depend on the nature of the solder being used. For a standard eutectic 63/37 tin/lead alloy, the solder reflow temperature will typically be at least about 190° C. For most other solders used in connection with packaged microelectronic components, reflow temperatures are in excess of 200° C., with lead-free solders typically having higher reflow temperatures than lead-based solders. In one embodiment of the invention, the packaged microelectronic components are heated in the heating apparatus 130 to a temperature that is as great as or greater than the solder reflow temperature. In another embodiment, the maximum temperature reliably achieved in the heating apparatus 130 may be slightly (e.g., 10–15° C.) less than the anticipated solder reflow temperature while still achieving many of the desired benefits of the invention.

In one particular embodiment, the microelectronic components are heated in the heating apparatus 130 to a temperature of at least about 215° C., e.g., about 215–230° C. In another embodiment, the packaged microelectronic components are heated to a temperature of at least about 220° C. In select embodiments of the invention useful for some lead-free solders, the packaged microelectronic components are heated to a temperature of about 250° C. or greater. The maximum temperature to which the components are heated in the heating apparatus 130 can exceed the maximum temperature to which the components will be heated in a subsequent solder reflow operation, but care should be taken not to exceed acceptable temperature limits of the elements and encapsulant of the microelectronic components.

In one embodiment of the invention, the packaged microelectronic components are heated at a ramp rate which is greater than a ramp rate at which packaged microelectronic components will be heated in a subsequent solder reflow operation. For example, microelectronic devices may be heated in a conventional reflow operation from about room temperature to about 220° C. over a period of about three minutes. This yields a ramp rate (i.e., temperature change divided by time) of a little over 1° C. per second. As explained previously, this ramp rate and the elevated temperatures achieved in the solder reflow operation may induce previously acceptable microelectronic components to fail.

Figure 7:
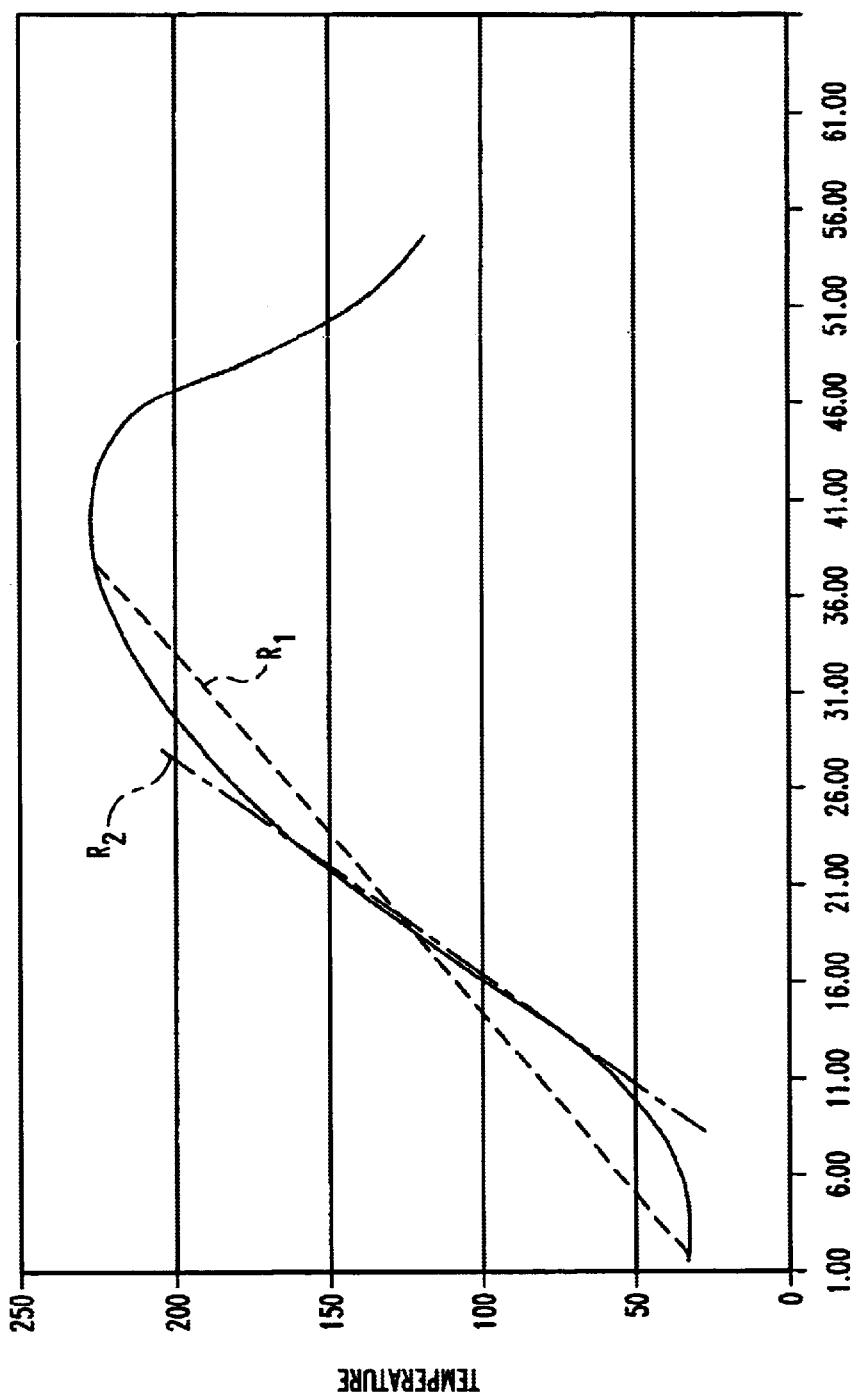
FIG. 7 is a graph illustrating an exemplary temperature profile suitable for heating microelectronic components in accordance with one specific embodiment.

FIG. 7 plots the temperature of a microelectronic component as a function of time in one exemplary heating process 310. In this process, the microelectronic components are heated from a temperature of about 30° C. to about 225° C. over the course of about 38 seconds. This yields an overall ramp rate $R_1$ of about 5° C. per second. Whereas that is the average ramp rate from the beginning of the heating process to the maximum temperature, the actual temperature increase need not be linear. In the process of FIG. 7, the temperature is increased from about 70° C. to about 170° C. over the course of about 10 seconds, yielding a maximum ramp rate $R_2$ of about 10° C. per second. In one embodiment, the microelectronic components are heated in the heating apparatus 130 at an average ramp rate during a heating period of at least about 5° C. per second, e.g., at least about 8° C. per second.

Once the microelectronic components have been heated to the desired temperature in the heating apparatus 130, they may be allowed to cool. This can be accomplished passively by allowing the microelectronic components to cool in an ambient environment. In one embodiment, though, the components are actively cooled, e.g., by using a dedicated cooling chamber 180. This will cool off the microelectronic components more rapidly, further thermally stressing the microelectronic components.

As noted above, in certain embodiments of the invention, packaged microelectronic components are removed from magazines 120 and added sequentially to the heating apparatus 130. The rather large thermal mass of the magazines with all of the microelectronic components loaded therein makes it difficult to ramp up the temperature of the microelectronic components rapidly. As compared to heating the microelectronic components individually or in strips, heating the entire magazine of components both reduces the thermal stress induced in the components and requires additional processing time, reducing throughput of the manufacturing system 100. Solder is typically applied to microelectronic components individually or in strips, requiring the individual components or strips of components to be removed from the magazine. In the manufacturing system 100 shown in FIG. 3, the heating system 130 is placed in line with the solder plating apparatus 200. Since the microelectronic components would have to be separated from the magazine 120 anyway, the microelectronic components can be heated and cooled fairly rapidly in a sequential, single-file arrangement without unduly decreasing throughput of the manufacturing system 100.

One skilled in this technology may expect heating the microelectronic components at a ramp rate which is significantly higher than the ramp rate experienced in a subsequent solder reflow operation to cause failure of microelectronic components which would otherwise survive the reflow process. Surprisingly, though, it has been found that the increased ramp rates (e.g., 5° C./second or more) utilized in embodiments of the invention do not significantly increase product failures.

After the packaged components are heated in step 310 and, optionally, cooled in step 312, solder may be applied to the contacts of the composite in step 320. As noted above, this may be accomplished in the solder plating apparatus 200 of FIG. 3. After the solder application 320, the solder-bearing packaged microelectronic components may be trimmed and formed (step 322) in the trim and form apparatus 220. These trimmed and formed microelectronic components may then be subjected to a standard burn-in test 324 in the test apparatus 230. Any products that are identified as defective by the processor-based system 240 can be sorted from the rest of the microelectronic components and shipped in step 330.

It has been found that the improved process 300 can significantly reduce "infant mortalities" in the field. In particular, a significant majority of the microelectronic components which pass a conventional burn-in test but fail during the subsequent solder reflow operation can be weeded out in the burn-in test 324 of the improved process 300. This can significantly reduce a microelectronic device manufacturer's costs for product losses or rebuilds.

Unless the context clearly requires otherwise, throughout the description and the claims the words "comprise," "comprising," and the like are to be construed in an inclusive sense as opposed to an exclusive or exhaustive sense i.e., in a sense of "including, but not limited to." Additionally, the words "herein," "above," "below," and words of similar import, when used in this application, shall refer to this application as a whole and not to any particular portions of this application. Use of the term "or," as used in this application with respect to a list of two or more items shall be interpreted to cover any, all, or any combination of items in the list.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of processing a packaged microelectronic component including at least one die, comprising:
   heating the packaged microelectronic component to a reflow temperature of a selected solder;
   after the heated packaged microelectronic component has cooled to a temperature below the reflow temperature, applying the selected solder to contacts carried by the cooled packaged microelectronic component;
   testing performance of the solder-bearing packaged microelectronic component; and
   rejecting as defective any packaged microelectronic component that fails to meet minimum performance criteria in the performance testing.

2. The method of claim 1 wherein heating the packaged microelectronic component comprises heating the packaged microelectronic component at a rate of at least about 5° C./second.

3. The method of claim 1 wherein heating the packaged microelectronic component comprises heating the packaged microelectronic component at a rate of at least about 8° C./second.

4. The method of claim 1 wherein heating the packaged microelectronic component comprises heating the packaged microelectronic component at a ramp rate greater than a ramp rate at which the packaged microelectronic component will be heated in a subsequent solder reflow operation.

5. The method of claim 1 wherein heating the packaged microelectronic component further comprises heating the packaged microelectronic component to a temperature greater than the reflow temperature.

6. The method of claim 1 wherein heating the packaged microelectronic component comprises heating the packaged microelectronic component to a temperature of about 215–230° C.

7. The method of claim 1 wherein heating the packaged microelectronic component comprises heating the packaged microelectronic component to a temperature of at least about 220° C.

8. The method of claim 1 wherein the testing comprises heating the microelectronic component to an elevated test temperature that is below the reflow temperature.

9. The method of claim 1 wherein the testing is conducted after the solder is applied to the contacts and the testing comprises heating the microelectronic component to an elevated test temperature that is below the reflow temperature.

10. The method of claim 1 wherein the packaged microelectronic component is heated to the reflow temperature in a heating chamber operatively associated with a solder plating apparatus used to apply the solder.

11. The method of claim 10 wherein the packaged microelectronic component is transferred directly from the heating chamber to the solder plating apparatus.

12. The method of claim 1 wherein the packaged microelectronic component is removed from a magazine carrying a plurality of other microelectronic components before heating the packaged microelectronic component to the reflow temperature.

13. The method of claim 1 wherein the packaged microelectronic component is mounted on a mounting tape, heating the packaged microelectronic component comprising heating the packaged microelectronic component and the tape.

14. The method of claim 1 wherein the packaged microelectronic component is mounted on a mounting tape, heating the packaged microelectronic component comprising heating the packaged microelectronic component and the tape, the packaged microelectronic component being removed from the mounting tape prior to the performance testing.

15. The method of claim 1 wherein the contacts of the packaged microelectronic component include at least one lead and applying the solder to the contacts comprises depositing solder on the at least one lead.

16. The method of claim 15 further comprising trimming the at least one lead.

17. A method of processing packaged microelectronic components at least one of which includes at least one die, comprising:

heating a plurality of packaged microelectronic components to a stress temperature of at least about 215° C.;

thereafter, applying a solder to a contact carried by at least one of the packaged microelectronic components;

testing performance of the at least one solder-bearing packaged microelectronic component; and rejecting as defective any packaged microelectronic component that fails to meet minimum performance criteria in the performance testing.

18. The method of claim 17 wherein heating the packaged microelectronic components comprises heating the packaged microelectronic components at a rate of at least about 5° C./second.

19. The method of claim 17 wherein heating the packaged microelectronic components comprises heating the packaged microelectronic components at a rate of at least about 8° C./second.

20. The method of claim 17 wherein heating the packaged microelectronic components comprises heating the packaged microelectronic components at a ramp rate greater than a ramp rate at which the packaged microelectronic components will be heated in a subsequent solder reflow operation.

21. The method of claim 17 wherein heating the packaged microelectronic components comprises heating the packaged microelectronic components to a temperature of about 215–230° C.

22. The method of claim 17 wherein heating the packaged microelectronic components comprises heating the packaged microelectronic components to a temperature of at least about 220° C.

23. The method of claim 17 wherein the testing comprises heating the microelectronic components to an elevated test temperature that is below 150° C.

24. The method of claim 17 wherein the testing is conducted after the solder is applied to the contacts and the testing comprises heating the at least one solder-bearing microelectronic components to an elevated test temperature that is below 150° C.

25. The method of claim 17 wherein the packaged microelectronic components are heated in a heating chamber operatively associated with a solder plating apparatus used to apply the solder.

26. The method of claim 25 wherein the packaged microelectronic components are transferred directly from the heating chamber to the solder plating apparatus.

27. The method of claim 17 wherein the packaged microelectronic components are initially carried in a magazine and the packaged microelectronic components are removed from the magazine before the heating of the packaged microelectronic components.

28. The method of claim 17 wherein at least two of the packaged microelectronic components are mounted on a common length of mounting tape, heating the packaged microelectronic components comprising heating the packaged microelectronic components and the tape.

29. The method of claim 17 wherein at least two of the packaged microelectronic components are mounted on a common length of mounting tape, heating the packaged microelectronic components comprising heating the packaged microelectronic components and the tape, the packaged microelectronic components being removed from the mounting tape prior to the performance testing.

30. The method of claim 17 wherein the contact comprises a lead and applying the solder to the contact comprise depositing solder on the lead.

31. The method of claim 30 further comprising trimming the lead.

32. A method of processing a packaged microelectronic component, comprising:

heating the packaged microelectronic component at a rate of at least about 5° C./second to a reflow temperature of a selected solder;

after the heated packaged microelectronic component has cooled to a temperature below the reflow temperature, applying the selected solder to a contact carried by the cooled packaged microelectronic component;

testing performance of the solder-bearing packaged microelectronic component; and rejecting as defective any packaged microelectronic component that fails to meet minimum performance criteria in the performance testing.

* * * * *